United States Patent [19]

Otthofer, Jr.

[11] 4,286,518
[45] Sep. 1, 1981

[54] PRINT SCREEN STENCIL

[75] Inventor: Jacob A. Otthofer, Jr., Lancaster, Pa.

[73] Assignee: Armstrong World Industries, Inc., Lancaster, Pa.

[21] Appl. No.: 60,456

[22] Filed: Jul. 25, 1979

[51] Int. Cl.³ .............................................. B41N 1/24
[52] U.S. Cl. ............................... 101/128.21; 430/308; 430/11; 101/128.4; 26/2 R; 26/18.5
[58] Field of Search ................ 101/128, 128.1, 128.21, 101/128.4, 125; 430/308, 17; 90/111, 114, 116, 115, 35.1

[56] References Cited

U.S. PATENT DOCUMENTS

| | | | |
|---|---|---|---|
| 2,675,315 | 4/1954 | Staehle et al. | 95/7 |
| 2,875,051 | 2/1959 | DeMaria | 96/67 |
| 2,977,227 | 3/1961 | DeMaria | 96/35 |
| 3,097,096 | 7/1963 | Oster | 96/30 |
| 3,202,513 | 8/1965 | Thommes | 96/115 |
| 3,210,187 | 10/1965 | Thommes | 96/35 |
| 3,259,499 | 7/1966 | Thommes | 96/115 |
| 3,469,982 | 9/1969 | Celeste | 98/35.1 |
| 3,615,450 | 10/1971 | Werber | 96/35.1 |
| 3,632,376 | 1/1972 | Newman | 101/128.4 X |
| 3,718,473 | 2/1973 | Gervay et al. | 96/83 |
| 3,787,213 | 1/1974 | Gervay et al. | 96/36 |
| 3,801,328 | 4/1974 | Takimoto et al. | 96/115 P |
| 3,951,657 | 4/1976 | Recchia et al. | 96/35.1 |
| 3,953,309 | 4/1976 | Gilano et al. | 204/159.16 |
| 3,981,985 | 9/1976 | Roberts | 430/17 X |
| 4,001,016 | 1/1977 | Rosenkranz et al. | 96/35.1 |
| 4,147,549 | 4/1979 | Held | 96/85 |
| 4,154,614 | 5/1979 | Tsunoda et al. | 431/308 X |
| 4,177,728 | 12/1979 | Koresla | 430/308 X |

FOREIGN PATENT DOCUMENTS 618181  4/1949  United Kingdom .

OTHER PUBLICATIONS

Neke et al., "Plastisol Imaging Systems", E. I. Du Pont de Nemours & Co., Inc., pp. 75, 76.

*Primary Examiner*—Edward M. Coven
*Attorney, Agent, or Firm*—Dennis M. Kozak; Daniel DeJoseph

[57] ABSTRACT

A print screen stencil for printing with corrosive printing compositions is disclosed. The stencil comprises a screen fabric having open mesh areas in a predetermined pattern adapted to allow the passage of a printing composition to a substrate positioned beneath the fabric and filled or closed mesh areas adapted to prevent the passage of a printing composition, the filled mesh areas comprising a resist coating encasing the mesh in the filled areas, the resist coating comprising cross-linked acrylic polymer intimately dispersed in fused vinyl resin.

1 Claim, No Drawings

PRINT SCREEN STENCIL

This invention relates to print screen stencils.

In one of its more specific aspects, this invention pertains to a print screen stencil produced using a photoactive plastisol block-out or resist composition. The resulting print screen stencil exhibits excellent life when used with corrosive printing compositions.

The direct method of preparing stencils is well known. Typically, the direct method involves the coating of a liquid light-sensitive emulsion directly onto the screen in order to sensitize the screen fabric. When exposed to actinic light through a film positive, the black portions of the positive will not allow light to penetrate to the screen and the emulsion will remain soft in those areas. In the areas of the screen which are exposed to light, the emulsion will harden and become insoluble in water during the developing process during which the screen is soaked and/or sprayed with water to dissolve and remove the unexposed emulsion.

A problem existing in the art is that these emulsions, direct or indirect, cannot reliably resist for long periods of time the corrosive damage caused by either caustic or acidic printing compositions, such as the acrylic and nylon fiber shrinking compositions used in screen process printing of pattern on carpet.

The present invention provides a print screen stencil produced using a photoactive plastisol resist composition which resists the corrosive damage caused by either caustic or acidic printing compositions and, accordingly, facilitates the production of print screen stencils which exhibit excellent life. The print screen stencils of this invention are particularly well suited for use with the highly acidic (pHs' less than 2) nylon fiber shrinking compositions employed in carpet screen process printing, such as the compositions taught in U.S. Pat. No. 4,129,416.

According to this invention, there is provided a print screen stencil for printing with corrosive printing compositions comprising a screen fabric having open mesh areas in a predetermined pattern adapted to allow the passage of a printing composition to a substrate positioned beneath the fabric and filled or closed mesh areas adapted to prevent the passage of a printing composition, the filled mesh areas comprising a resist coating encasing the mesh in the filled areas, the resist coating comprising cross-linked acrylic polymer intimately dispersed in fused vinyl resin.

Also according to this invention, there is provided a method of producing a print screen stencil for printing with corrosive printing compositions comprising (a) coating an open mesh print screen fabric with a photoactive plastisol resist coating composition comprising a vinyl resin, a vinyl resin plasticizer, a cross-linking acrylic monomer, and a photoinitiator; (b) imagewise exposing the coated screen fabric to actinic light through a film positive to cross-link the acrylic monomer in those areas of the coated screen fabric struck by actinic light; (c) treating the exposed coated screen fabric to remove the plastisol resist coating composition from the non-actinic light struck areas and thereby form open mesh areas which will permit the passage of a printing composition; and, (d) heating the treated screen fabric to fuse the plastisol resist coating composition which remains on the screen fabric in the actinic light struck areas and thereby form filled or closed mesh areas which will prevent the passage of a printing composition.

To produce the photoactive plastisol resist coating composition of this invention it is preferred that the plastisol be formulated separately and then mixed with the acrylic monomer and photoinitiator to produce the resist coating composition.

To produce the plastisol, use can be made of any vinyl resin or vinyl resin blend conventionally employed in plastisol compounding.

Particularly suitable for use are blends of polyvinyl chloride homopolymer and polyvinyl chloridepolyvinyl acetate copolymer dispersion grade resins with polyvinyl chloride homopolymer and polyvinyl chloridepolyvinyl acetate copolymer blending grade resins.

As the plasticizer to produce the plastisol, use can be made of any general type plasticizer or plasticizer system conventionally employed in plastisol compounding.

The general types of plasticizers are phthalate plasticizers, phosphate plasticizers, and the like and mixtures thereof. A particularly suitble plasticizer for use is dioctyl phthalate.

From about 25 to about 250 parts of plasticizer will be employed per every 100 parts of vinyl resin, or vinyl resin blend.

Optionally, the plastisol can contain at least one heat stabilizer. Particularly suitable stabilizers include barium neodecanoate and zinc neodecanoate.

Stabilizer can be employed in a total amount within the range of from about 0.2 to about 10 parts per 100 parts of vinyl resin or vinyl resin blend.

To produce a resist coating composition, acrylic cross-linking monomer will be employed in a parts by weight ratio of acrylic cross-linking monomer to plastisol of 1:1 to 1:19. Any suitable acrylic cross-linking monomer can be employed.

Suitable monomers include trimethylolpropanetriacrylate; hexanedioldiacrylate; pentaerythritol tetracrylate; butanediol diacrylate; 1,3-butyleneglycol diacrylate; diacrylates of diethyleneglycol, triethyleneglycol, and tetraethyleneglycol; isocyanuricacid triacrylate; pentaerythritol triacrylate; Bisphenol A diacrylate; methacrylates and the like and mixtures thereof.

A particularly suitable acrylic cross-linking monomer is designated "SR 351" commercially available from Sartomer Company a division of Sartomer Industries. SR 351 is trimethylolpropane triacrylate.

The photoactive plastisol resist coating composition will contain from about 0.2 to about 10 parts of photoinitiator every 100 parts by weight of total plastisol and acrylic cross-linking monomer. Any suitable photoinitiator can be employed.

Suitable photoinitiators include benzophenone, benzoin isobutyl ether, diethoxyacetophenone, benzoin methyl ether and the like, and mixtures thereof.

The photoactive plastisol resist composition can be prepared by any suitable method such as described below. Preferably, as stated above, the plastisol is separately prepared and the acrylic cross-linking monomer and photoinitiator are mixed with the plastisol to produce a resist coating composition for use in this invention.

To produce a print screen stencil, the resist composition is applied to any conventional open mesh screen fabric used in screen process printing, being overall uniformly applied using any suitable means of application such as a squeegee or scoop coater.

After the resist composition is applied, a film positive of any desired pattern is superimposed on one surface of resist coating and the coated screen fabric is exposed through the film positive to a dosage of actinic light effective to cross-link the acrylic monomer in the exposed resist coated areas of the screen fabric.

Any suitable source of actinic light can be employed. Particularly, suitable for use are mercury vapor lamps and black lamp, blue glass lights.

One particularly suitable mercury vapor lamp is designated "Ascor Addalux" 5 KW High Intensity UV Printing Light commercially available from Berkey Technical Company, Woodside, New York. A suitable black lamp, blue glass light is designed GE Black Light F15T8BLB 15 W. Using the above lights, intensities as low as 0.04 joules/cm$^2$ have been found effective to cross-link the acrylic monomer in the photoactive plastisol resist coating composition of this invention.

If desired, a thin film of a suitable material such as polyethylene or "Mylar" can be placed between the resist coated screen fabric and the film positive rather than placing the film directly on the resist coating. The use of a film serves to eliminate the need to clean any wet resist composition adhering to the film before reusing the film.

Upon exposure, the acrylic monomer cross-links in the actinic light struck areas and serves to hold or lock the unfused plastisol in place on the screen so that when the film positive is removed and the coated screen is treated, typically washed out by spraying with warm or hot water from the backside of the screen, only the unexposed or non-actinic light struck areas of the resist coating wash out to form open mesh areas. The resist coating in the exposed or actinic light struck areas resists washout and remains intact encasing the mesh on the screen fabric.

After treating the screen to remove resist coating from the unexposed areas, the screen is placed in a conventional oven and heated to a temperature sufficient to fuse the plastisol in the resist composition which composition at this point has cross-linked acrylate interspersed throughout.

The resulting print screen stencil is suitable for use with any conventional printing composition such as printing inks, lacquers, metallic powders and pastes. The screen stencil of this invention has particular utility when used to print corrosive, shrinking or embossing compositions on fabrics, especially carpet.

Having described the ingredients and methods of this invention, reference is now made to the following examples which set forth the best mode for practicing the invention.

EXAMPLE I

This example demonstrates the preparation of a plastisol used in the preparation of the photoactive plastisol resist coating compositions of Examples II through VIII. To produce the plastisol, the following amounts of ingredients were employed:

| Ingredient | Amount (Kg) |
|---|---|
| polyvinyl chloride - polyvinylacetate copolymer dispersion grade resin (designated "Tenneco Blacar 0565" commerically available from Tenneco Chemicals, Inc.) | 10.9 |
| polyvinyl chloride - polyvinylacetate copolymer blending grade resin (designated "Tenneco 521, commercially available from Tenneco Chemicals, Inc.) | 7.3 |
| plasticizer - dioctyl phthalate | 7.3 |
| stabilizers - (1) zinc neodeconoate | 0.03 |
| (2) barium neodeconoate | 0.03 |

The total amounts of both resins were added to a blade mixer at room temperature and tumbled dry.

The total amount of plasticizer was introduced into the resulting resin blend with agitation at room temperature.

The total amounts of both stabilizers were added and agitation was continued until a fluid homogeneous plastisol was formed.

The resulting plastisol was tested and found to have a viscosity of 129,000 as measured by a Brookfield Viscometer, Model RVF, #6 spindle, 4 rpm.

EXAMPLE II

This example demonstrates the preparation of a photoactive plastisol resist coating composition of this invention. The following amounts of ingredients were employed.

| Ingredient | Amount (Parts by Weight) |
|---|---|
| plastisol of Example I | 65 |
| trimethylolpropane triacrylate | 35 |
| initiators: | |
| bezoin isobutyl ether | 1.34 |
| benzophenone (liquid) | 0.9 |

The total amounts of all ingredients were added to a mixing vessel at room temperature and agitated until all ingredients were uniformly distributed throughout the plastisol. The resulting composition was recovered as a photoactive plastisol resist coating composition of this invention suitable for use to produce print screen stencils.

Using substantially the procedure of Example II, six more photoactive plastisol resist coating compositions were prepared. Table I shows the amounts of ingredients (expressed in parts by weight) employed to produce Examples III through VIII.

TABLE I

| Ingredient | Example No. | | | | | |
|---|---|---|---|---|---|---|
| | III | IV | V | VI | VII | VIII |
| plastisol of Example I | 70 | 75 | 80 | 85 | 40 | 95 |
| trimethylolpropane triacrylate | 30 | 25 | 20 | 15 | 10 | 5 |
| initiators: | | | | | | |
| benzoin isobutyl ether | 1.34 | 1.34 | 1.34 | 1.34 | 1.34 | 1.34 |
| benzophenone (liquid) | 0.9 | 0.9 | 0.9 | 0.9 | 0.9 | 0.9 |

EXAMPLE IX

This example demonstrates the preparation of print screen stencils using the above prepared seven photoactive plastisol resist coating compositions.

To one side of each of seven samples of monofilament polyester screen fabric having a mesh count of 72 per lineal inch and 43 percent open area was separately taped a film positive.

The opposite side of each of the seven screen samples was separately blade coated with a different photoactive plastisol resist coating composition of Examples II through VIII.

Each of the seven screen samples was subjected to actinic radiation by separately placing each sample, film side facing the light, under an Ascor Addalux 5 KW High Intensity UV Printing Light for about 9 minutes with a distance of 40 inches between the sample and the light. Although all samples were subjected to radiation for about 9 minutes, additional testing demonstrated that exposure times as short as 10 seconds under the same light and conditions were sufficient to cross-link the acrylic monomer in the resist coating composition.

Next, the films were removed from the backsides of the samples and the non-actinic light struck areas of each screen were washed out using a hot water spray applied to the backsides of the screen.

The screen samples were then placed in a hot air oven for about 5 minutes at a temperature of from about 285° to 300° F. to fuse the plastisol resist coating composition remaining on the screen samples in the light struck regions.

The screen samples were moved from the oven as print screen stencils ready for use in screen process printing.

Three of the print screen stencils produced above, those coated with the photoactive plastisol resist coating compositions of Examples II, VII and VIII, were subjected to stencil print life testing using a nylon fiber shrinking composition of U.S. Pat. No. 4,129,416 having a pH of about 0.1 and compared to a similarly tested print screen stencil produced by the indirect method using a pigmented catalyzed urethane polyester coating, designated "Blockout Paint Black, 83-4" commercially available from Gilman Paint & Varnish Co., Chattanooga, TN. Blockout Paint Black 83-4 is recommended for use for production line screen printing of pattern on carpet and is considered to be the best prior art. Table II shows the results of the testing:

TABLE II

| Print Screen Stencil Produced Using: | Square Yards Printed | Observation After Testing |
| --- | --- | --- |
| photoactive plastisol resist coating composition of Example II | 57,044 | No corrosion, flaking, chipping or deterioration of resist coating. No loss of pattern detail. Screen still usable. |
| photoactive plastisol resist coating composition of Example VII | 57,044 | No corrosion, flaking, chipping or deterioration of resist coating. No loss of pattern detail. Screen still usable. |
| photoactive plastisol resist coating composition of Example VIII | 57,044 | No corrosion, flaking, chipping or deterioration of pattern detail. No loss of pattern detail. Screen still usable. |
| Prior Art - Gilman Blockout Paint Black 83-4 | 14,600 | Pin holes in resist coating. Flaking and chipping of resist coating. Loss of pattern detail. Screen no longer usable. |

The above data indicate that print screen stencils of this invention possess improved resistance to corrosive damage as compared to prior art print screen stencils. As can be seen from the data, the screens of this invention demonstrate a screen life at least four times as long as the prior art screens.

It will evident from the foregoing that various modifications can be made to this invention. Such, however, are considered to be within the scope of this invention.

What is claimed is:

1. A print screen stencil for printing with corrosive printing compositions comprising a screen fabric having open mesh areas in a predetermined pattern adapted to allow the passage of a printing composition to a substrate positioned beneath the fabric and filled or closed mesh areas adapted to prevent the passage of a printing composition, the filled mesh areas comprising a resist coating encasing the mesh in the filled areas, said resist coating comprising cross-linked acrylic polymer intimately dispersed in fused vinyl resin.

* * * * *